(12) United States Patent
Rhodes

(10) Patent No.: US 6,646,298 B2
(45) Date of Patent: Nov. 11, 2003

(54) CAPACITOR WITH OXYGENATED METAL ELECTRODES AND HIGH DIELECTRIC CONSTANT MATERIALS

(75) Inventor: Howard E. Rhodes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 90 days.

(21) Appl. No.: 09/975,884

(22) Filed: Oct. 11, 2001

(65) Prior Publication Data

US 2003/0011012 A1 Jan. 16, 2003

Related U.S. Application Data

(62) Division of application No. 09/903,150, filed on Jul. 11, 2001, now Pat. No. 6,495,428.

(51) Int. Cl.[7] .............................................. H01L 27/108
(52) U.S. Cl. ...................... 257/306; 257/309; 257/310; 257/532
(58) Field of Search ...................... 438/3, 240, 396, 438/253, 250, 393; 257/296, 301, 303, 306, 307, 308, 309, 310, 532

(56) References Cited

U.S. PATENT DOCUMENTS

| 5,773,314 A | 6/1998 | Jiang et al. |
| 5,786,248 A | 7/1998 | Schuegraf |
| 5,807,774 A * | 9/1998 | Desu et al. .................. 438/240 |
| 5,814,852 A | 9/1998 | Sandhu et al. |
| 5,852,307 A * | 12/1998 | Aoyama et al. ............ 257/295 |
| 5,935,650 A | 8/1999 | Lerch et al. |
| 5,994,153 A | 11/1999 | Nagel et al. |
| 6,017,789 A | 1/2000 | Sandhu et al. |
| 6,030,847 A | 2/2000 | Fazan et al. |
| 6,133,159 A | 10/2000 | Vaartstra et al. |
| 6,162,744 A | 12/2000 | Al-Shareef et al. |
| 6,165,834 A | 12/2000 | Agarwal et al. |
| 6,204,142 B1 | 3/2001 | Thakur |
| 6,204,178 B1 | 3/2001 | Marsh |
| 6,541,067 B1 * | 4/2003 | Marsh et al. ................ 427/252 |
| 2001/0016382 A1 * | 8/2001 | Song et al. .................. 438/240 |
| 2001/0043453 A1 * | 11/2001 | Narwankar et al. ...... 361/306.3 |
| 2003/0003697 A1 * | 1/2003 | Agarwal et al. ............ 438/496 |

OTHER PUBLICATIONS

Won et al., Conformal CVD–Ruthenium Process for MIM Capacitor in Giga–bit DRAMs, Electron Devices Meeting, 2000, IEDM Technical Digest. International, pp. 789–792.*

Tsunemine et al., A manufacturable integration technology of sputter–BST capacitor with a newly proposed thick Pt electrode, IEEE, 1998, pgs. 30.3.1–30.3.4.

* cited by examiner

Primary Examiner—Tuan H. Nguyen
(74) Attorney, Agent, or Firm—Dinsmore & Shohl LLP

(57) ABSTRACT

A stabilized capacitor using high dielectric constant dielectric materials, such as $Ta_2O_5$ and $Ba_xSr_{(1-x)}TiO_3$, and methods of making such capacitors are provided. A preferred method includes chemical vapor depositing a metal electrode, oxygen doping the metal electrode, oxidizing a surface of the oxygen doped metal electrode, depositing a high dielectric constant oxide dielectric material on the oxidized oxygen-doped metal electrode, and depositing an upper layer electrode on the high dielectric constant oxide dielectric material.

26 Claims, 3 Drawing Sheets

CAPACITOR WITH OXYGENATED METAL ELECTRODES AND HIGH DIELECTRIC CONSTANT MATERIALS

CROSS-REFERENCE TO RELATED APPLICATION

This application is a division of U.S. application Ser. No. 09/903,150, filed Jul. 11, 2001, now U.S. Pat. No. 6,495,428 B1, issued Dec. 17, 2002.

BACKGROUND OF THE INVENTION

This invention relates generally to capacitors, and more particularly to capacitors made with high dielectric constant dielectric materials having reduced leakage current, and to methods of making such capacitors and their incorporation into DRAM cells.

The increase in memory cell density in DRAMs presents semiconductor chip designers and manufacturers with the challenge of maintaining sufficient storage capacity while decreasing cell area. One way of increasing cell capacitance is through cell structure techniques, including three dimensional cell capacitors. The continuing drive to decrease size has also led to consideration of materials with higher dielectric constants for use in capacitors. Dielectric constant is a value characteristic of a material and is proportional to the amount of charge that can be stored in a material when the material is interposed between two electrodes. Promising dielectric materials include $Ba_xSr_{(1-x)}TiO_3$ ("BST"), $BaTiO_3$, $SrTiO_3$, $PbTiO_3$, $Pb(Zr,Ti)O_3$ ("PZT"), $(Pb,La)(Zr,Ti)O_3$ ("PLZT"), $(Pb,La)TiO_3$ ("PLT"), $KNO_3$, $Nb_2O_5$, $Ta_2O_5$, and $LiNbO_3$, all of which have high dielectric constants making them particularly desirable for use in capacitors. However, the use of these materials has been hampered by their incompatability with current processing techniques and their leakage current characteristics. For example, present $RuO_x/Ta_2O_5/TiN$ capacitor structures show several orders of magnitude leakage degradation after subsequent rapid thermal processing (RTP) at 650° C. in a nitrogen atmosphere.

Producing a metal/insulator/metal structure that does not degrade under subsequent high temperature processing remains an unsolved problem for incorporating high dielectric constant (high K) materials into advanced DRAM cells. A concern with using metal electrodes in the capacitor structure is that there is vacancy diffusion during subsequent high temperature treatments. At the electrode interface boundary, it would be advantageous to have an electrode that could supply oxygen to fill oxygen vacancies.

The use of oxygen-doped, sputter deposited platinum (PVD Pt) electrodes have been proposed in the literature. Y. Tsunemine, et al., "A manufacturable integration technology of sputter-BST capacitor with a newly proposed thick Pt electrode," 1998 IEDM 30.3.1. However, PVD Pt electrodes cannot be used in capacitor container structures. As shown in FIG. 1, when a layer of Pt 12 is sputter deposited in a container structure 10, the deposition produces uneven layer thicknesses. Because conformal coverage is required for capacitor container structures, sputter deposition cannot be used.

Therefore, there remains a need in this art for improved processes for incorporating high dielectric constant dielectric materials into capacitor constructions and for capacitors containing these materials.

SUMMARY OF THE INVENTION

The present invention meets these needs by providing a stabilized capacitor having improved leakage current characteristics using high dielectric constant oxide dielectric materials, and methods of making such capacitors. By "high dielectric constant oxide dielectric" materials we mean oxides of barium, titanium, strontium, lead, zirconium, lanthanum, and niobium, including, but not limited to $Ba_xSr_{(1-x)}TiO_3$ ("BST"), $BaTiO_3$, $SrTiO_3$, $Ta_2O_5$, $Nb_2O_5$, $PbTiO_3$, $Pb(Zr,Ti)O_3$ ("PZT"), $(Pb,La)(Zr,Ti)O_3$ ("PLZT"), $(Pb,La)TiO_3$ ("PLT"), $KNO_3$, and $LiNbO_3$ and having a dielectric constant of at least about 20.

In accordance with one aspect of the present invention, the method includes depositing a metal electrode on a semiconductor substrate, oxygen doping the metal electrode, oxidizing an upper surface of the oxygen-doped metal electrode, depositing a high dielectric constant oxide dielectric material on the oxidized oxygen-doped metal electrode, and depositing an upper layer electrode on the high dielectric constant oxide dielectric material. The metal electrode is preferably selected from the group consisting of TiN, Pt, Rh, Ru, Re, Ir, Os, and alloys and intermetallic compounds thereof. The upper layer electrode is preferably selected from the group consisting of TiN, W, Pt, Rh, Ru, Re, Ir, Os, and alloys and intermetallic compounds thereof. The high dielectric constant oxide dielectric material is preferably selected from the group consisting of $Ta_2O_5$ and $Ba_xSr_{(1-x)}TiO_3$.

The oxygen doping is preferably obtained by chemical vapor depositing the metal electrode in an oxygen-containing environment. By "oxygen containing environment," it is meant an atmosphere which contains gaseous oxygen. The upper layer electrode is also preferably chemical vapor deposited in an oxygen-containing environment. In a preferred form, the method deposits the metal electrode layer and/or the upper layer electrode using chemical vapor deposition (CVD) techniques.

Another aspect of the invention provides a capacitor including an oxygen-doped metal electrode having an oxidized surface, a high dielectric constant oxide dielectric material adjacent to the oxidized surface of the oxygen-doped metal electrode, and an upper layer electrode adjacent to the high dielectric constant oxide dielectric material. The metal electrode is preferably selected from the group consisting of TiN, Pt, Rh, Ru, Re, Ir, Os, and alloys and intermetallic compounds thereof. The upper layer electrode is preferably selected from the group consisting of TiN, W, Pt, Rh, Ru, Re, Ir, Os, and alloys and intermetallic compounds thereof. The high dielectric constant oxide dielectric material is preferably selected from the group consisting of $Ta_2O_5$ and $Ba_xSr_{(1-x)}TiO_3$.

Both the metal electrode and the upper layer electrode are preferably deposited using chemical vapor deposition (CVD) techniques. Also, preferably, both the metal electrode and the upper layer electrode are doped with oxygen.

The capacitor may also include a first layer of a chemical vapor deposited metal electrode beneath the oxygen-doped layer of the metal electrode, and a second layer of a chemical vapor deposited upper layer electrode adjacent to the first layer of the upper layer electrode.

Accordingly, it is a feature of the present invention to provide a stabilized capacitor having improved leakage current characteristics using high dielectric constant oxide dielectric materials, their incorporation into DRAM cells, and methods of making such capacitors. These, and other features and advantages of the present invention, will become apparent from the following detailed description, the accompanying drawings, and the appended claims.

DETAILED DESCRIPTION OF THE PREFERRED EMBODIMENT

Figure 1:
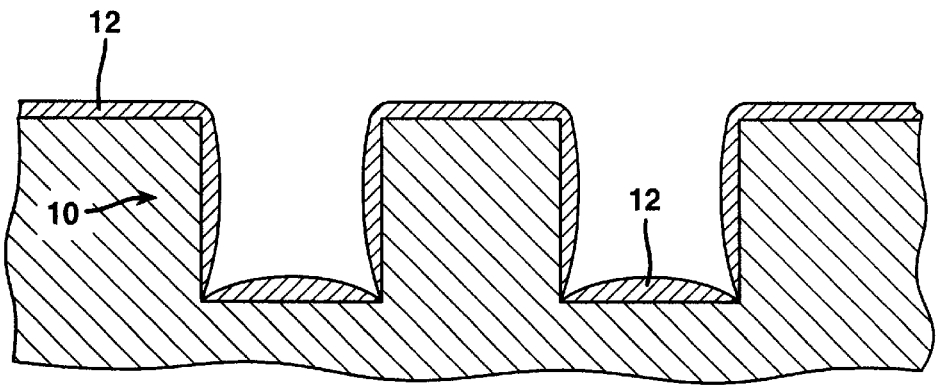
FIG. 1 is a diagrammatic sectional view of a prior art sputter deposited platinum electrode in a container structure fragment.
Figure 2:
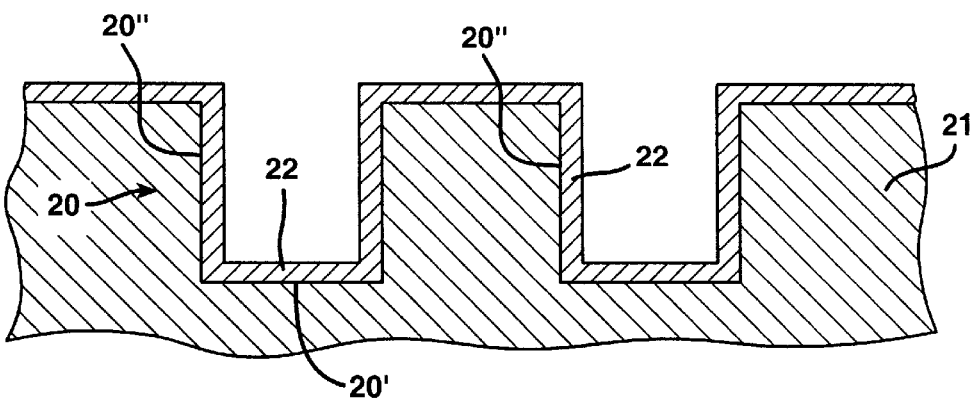
FIG. 2 is a diagrammatic sectional view of a chemical vapor deposited metal electrode in a capacitor container structure fragment in accordance with one embodiment of the present invention.

As shown in FIG. 2, a fragmentary view of a semiconductor substrate and a container capacitor structure is indicated generally by reference numeral 20. As shown, the container capacitor structure includes a base 20' and generally vertical sidewalls 20". As used herein, the term "semiconductor substrate" refers to silicon structures including silicon wafers, silicon structures in the process of fabrication, a semiconductor layer, including a semiconductor layer in the process of fabrication, and the like. The semiconductor substrate 20 includes a bulk silicon substrate 21. There is a metal electrode 22 formed as a layer on substrate 20. Preferably, the metal electrode layer 22 has been chemical vapor deposited. Chemical vapor deposition provides conformal coverage, which is necessary for capacitor container structures.

Figure 3:
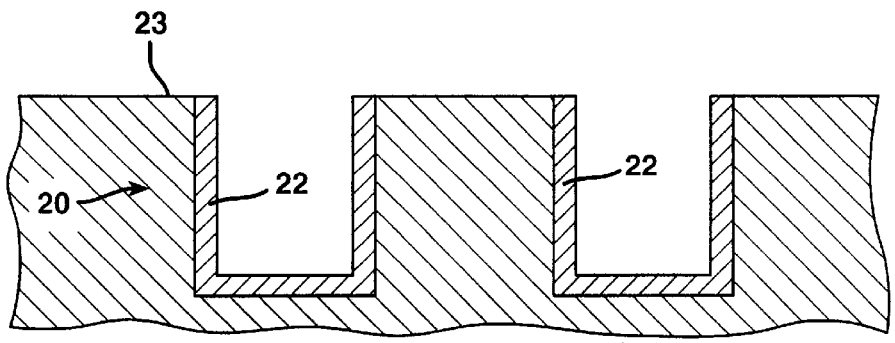
FIG. 3 is a diagrammatic sectional view of the chemical vapor deposited metal electrode of FIG. 2 after etching or chemical mechanical polishing.

FIG. 3 shows the container capacitor structure fragment 20 of FIG. 2 after the metal electrode 22 has been etched back or chemical mechanical polished to remove the metal above the upper surface 23 of the container structure. Preferably, metal electrode 22 is formed such that it is oxygen doped. A preferred process for oxygen doping is chemical vapor deposition in an oxygen-containing gas environment. Examples of suitable materials for metal electrode 22 include, but are not limited to, TiN, Pt, Rh, Ru, Re, Ir, Os, and alloys and intermetallic compounds thereof.

Surface 24 of the oxygen-doped metal electrode 22 is then oxidized. The oxidation is preferably a gas plasma treatment under oxidizing conditions and is preferably carried out at a temperature of between about 250° to about 500° C., and preferably about 400° C. using a gas containing either $O_2$ or $O_3$. For example, gas plasma may be formed using microwave power on oxygen or ozone gas sufficient to dissociate the oxygen molecules into individual activated atoms. With this step, the surface of metal electrode 22 is oxidized. This provides at least the surface, and preferably an upper portion of the electrode, with enough oxygen so that electrode 22 will be stable with the high dielectric constant oxide dielectric layer 26.

A layer of a high dielectric constant oxide dielectric material 26 is deposited on the oxidized surface 24 of the oxygen-doped metal electrode 22. Suitable materials for use as the high dielectric constant oxide dielectric include, but are not limited to, $Ba_xSr_{(1-x)}TiO_3$("BST"), $BaTiO_3$, $SrTiO_3$, $Ta_2O_5$, $Nb_2O_5$, $PbTiO_3$, $Pb(Zr,Ti)O_3$("PZT"), $(Pb,La)(Zr,Ti)O_3$("PLZT"), $(Pb,La)TiO_3$("PLT"), $KNO_3$, and $LiNbO_3$. Preferably, the high dielectric constant oxide dielectric material is selected from the group consisting of $Ta_2O_5$ and $Ba_xSr_{(1-x)}TiO_3$, where x is >0 and <1.

The upper electrode 28 is deposited on the high dielectric constant dielectric layer 26. Upper electrode 28 is preferably chemical vapor deposited in an oxygen environment to provide an oxygen-doped upper electrode. The upper electrode in the capacitor structure may be made from materials including, but not limited to, TiN, W, Pt, Rh, Ru, Re, Ir, Os, and alloys and intermetallic compounds thereof.

Figure 4:
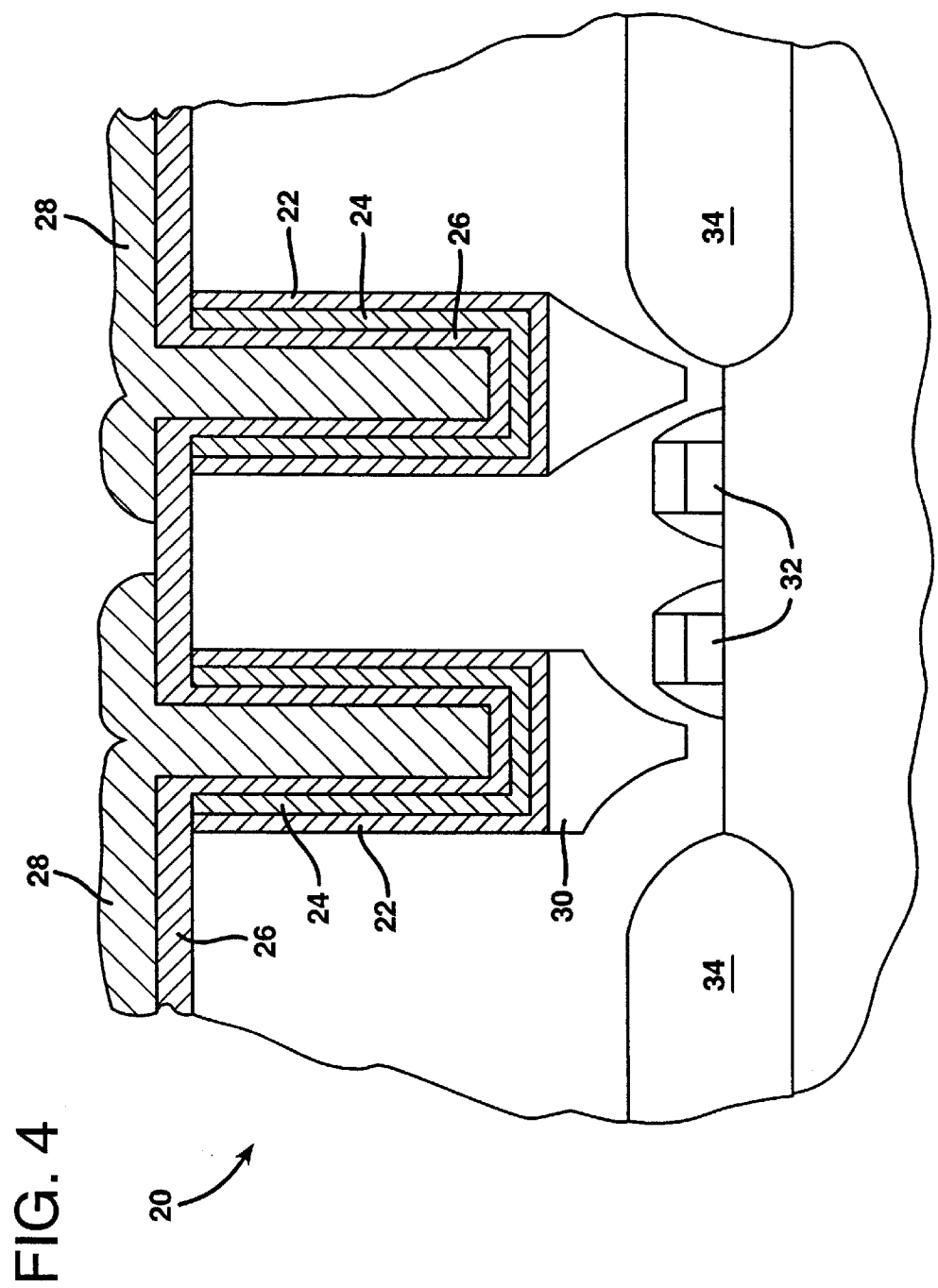
FIG. 4 is a diagrammatic fragmentary sectional view of a container capacitor structure made according to one embodiment of the present invention.

Referring now to FIG. 4, the capacitor includes a conductive plug 30 at the bottom of the container capacitor structure constituting a node to which electrical connection to capacitor 22 is made. Transistor 32 and field oxide 34 operate in conjunction with the capacitor.

Figure 5:
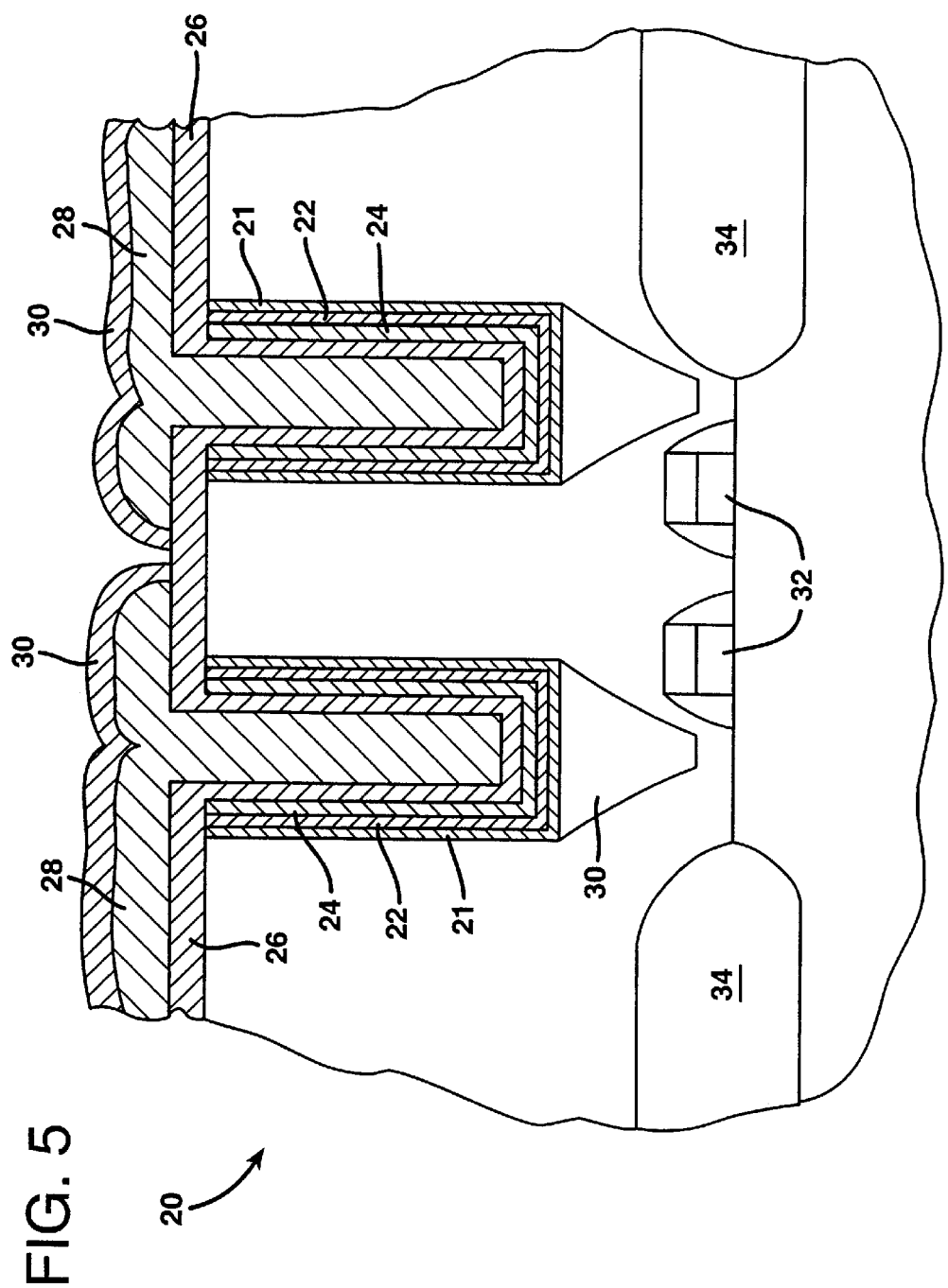
FIG. 5 is a diagrammatic fragmentary sectional view of an alternative container capacitor structure made according to another embodiment of the present invention.

In an alternative embodiment shown in FIG. 5 (with like numerals designating like structures), the container capacitor structure fragment includes a first layer of a metal electrode 21. The oxygen-doped metal electrode 22 is adjacent to the first layer of the metal electrode 21. The surface 24 of oxygen-doped metal electrode 22 is oxidized. The high dielectric constant oxide dielectric material 26 is deposited on surface 24 of oxygen-doped metal electrode 22. Oxygen-doped upper electrode 28 is adjacent to the high dielectric constant dielectric layer 26. A second layer of upper electrode 30 is deposited on oxygen-doped upper electrode 28.

When $RuO_x$ is used as the metal electrode 22, where x is >0 and <2, one example of a process for depositing electrode 24 is to deposit $RuO_x$ using chemical vapor deposition (CVD) of a metalorganic precursor containing ruthenium. Typically, this process would be carried out in a reaction chamber at a pressure of about 1 Torr and a temperature of from about 150° to about 200° C. using appropriate gas flow rates for the metalorganic precursor.

$RuO_x$ films as deposited include both $RuO_2$ and Ru phases. The presence of the Ru phase causes unstable reactions, e.g., the oxidation of Ru to $RuO_2$ during $Ta_2O_5$ metal-insulator-metal processing. This is undesirable because it deteriorates the oxidation kinetics of $Ta_2O_5$ and also causes formation of interface defects between $RuO_x$ and $Ta_2O_5$. Oxidization of the upper surface of the $RuO_x$ film prior to $Ta_2O_5$ deposition provides a stable $RuO_x/Ta_2O_5$ interface. The overall thickness of the $RuO_x$ electrode should be in the range of from about 50 to about 1000 Å, and preferably between about 100 and 200 Å. The oxidation should be limited to the upper surface of the $RuO_x$ film, penetrating only from about 10 to about 50 Å. If the oxidation is carried out through the entire thickness of the electrode, rather than just the surface, the electrode layer becomes very rough and disturbed.

The oxidation can use low-temperature annealing for a short time. For example, oxidation may be carried out at a temperature in the range of from about 400° to about 475° C. in an atmosphere containing $O_2$, $O_3$, or $N_2O$. The oxidation should be carried out at these relatively low temperatures because $RuO_4$, which is a vapor, forms at higher temperatures, leading to the loss of material from the surface of the electrode. The oxidation can be performed either before or after crystallization of the $RuO_x$. Alternatively, rather than depositing a layer of $RuO_x$, a layer of Ru metal may be deposited and then the surface of the electrode oxidized in this manner to form a layer of $RuO_x$.

While certain representative embodiments and details have been shown for the purpose of illustrating the invention, it will be apparent to those skilled in the art that various changes in the methods and apparatus disclosed herein may be made without departing from the scope of the invention, which is defined in the appended claims.

What is claimed is:

1. A capacitor comprising: a semiconductor substrate including a base and generally vertical sidewalls extending from said base, a layer of a chemical vapor deposited metal lower electrode doped with oxygen having an oxidized surface conformally covering said base and said sidewalls of said semiconductor substrate, a high dielectric constant oxide dielectric material adjacent to said oxidized surface of said metal lower electrode, and an upper layer electrode adjacent to said high dielectric constant oxide dielectric material.

2. A capacitor as claimed in claim 1 wherein said metal electrode is selected from the group consisting of TiN, Pt, Rh, Ru, Re, Ir, Os, and alloys and intermetallic compounds thereof.

3. A capacitor as claimed in claim 1 wherein said upper layer electrode is selected from the group consisting of TiN, W, Pt, Rh, Ru, Re, Ir, Os, and alloys and intermetallic compounds thereof.

4. A capacitor as claimed in claim 1 wherein said high dielectric constant oxide dielectric material is selected from the group consisting of $Ta_2O_5$ and $Ba_xSr_{(1-x)}TiO_3$.

5. A capacitor comprising: a semiconductor including a base and generally vertical sidewalls extending from said base, a layer of a chemical vapor deposited metal lower electrode doped with oxygen having an oxidized surface conformally covering said base and said sidewalls of said semiconductor substrate, a high dielectric constant oxide dielectric material adjacent to said oxidized surface of said metal lower electrode, and a chemical vapor deposited upper layer electrode doped with oxygen adjacent to said high dielectric constant oxide dielectric material.

6. A capacitor as claimed in claim 5 wherein said metal electrode is selected from the group consisting of TiN, Pt, Rh, Ru, Re, Ir, Os, and alloys and intermetallic compounds thereof.

7. A capacitor as claimed in claim 5 wherein said upper layer electrode is selected from the group consisting of TiN, W, Pt, Rh, Ru, Re, Ir, Os, and alloys and intermetallic compounds thereof.

8. A capacitor as claimed in claim 5 wherein said high dielectric constant oxide dielectric material is selected from the group consisting of $Ta_2O_5$ and $Ba_xSr_{(1-x)}TiO_3$.

9. A capacitor comprising: a semiconductor including a base and generally vertical sidewalls extending from said base, a chemical vapor deposited metal lower electrode doped with oxygen and having an oxidized surface conformally covering said base and said sidewalls of said semiconductor substrate, said metal electrode selected from the group consisting of TiN, Pt, Rh, Ru, Re, Ir, Os, and alloys and intermetallic compounds thereof, a high dielectric constant oxide dielectric material selected from the group consisting of $Ta_2O_5$ and $Ba_xSr_{(1-x)}TiO_3$ adjacent to said oxidized surface of said metal lower electrode, and a chemical vapor deposited upper layer electrode doped with oxygen, said upper layer electrode selected from the group consisting of TiN, W, Pt, Rh, Ru, Re, Ir, Os, and alloys and intermetallic compounds thereof adjacent to said high dielectric constant oxide dielectric material.

10. A capacitor comprising: a semiconductor including a base and generally vertical sidewalls extending from said base, a first layer of a chemical vapor deposited metal lower electrode conformally covering said base and said sidewalls of said semiconductor substrate, a second layer of a chemical vapor deposited metal lower electrode doped with oxygen and having an oxidized surface adjacent to said first layer of said metal lower electrode, a high dielectric constant oxide dielectric material adjacent to said oxidized surface of said second layer of said metal lower electrode, a first layer of a chemical vapor deposited upper layer electrode doped with oxygen adjacent to said high dielectric constant oxide dielectric material, and a second layer of a chemical vapor deposited upper layer electrode adjacent to said first layer of said upper electrode.

11. A capacitor as claimed in claim 10 wherein said metal electrode is selected from the group consisting of TiN, W, Pt, Rh, Ru, Re, Ir, Os, and alloys and intermetallic compounds thereof.

12. A capacitor as claimed in claim 10 wherein said upper layer electrode is selected from the group consisting of TiN, W, Pt, Rh, Ru, Re, Ir, Os, and alloys and intermetallic compounds thereof.

13. A capacitor as claimed in claim 10 wherein said high dielectric constant oxide dielectric material is selected from the group consisting of $Ta_2O_5$ and $Ba_xSr_{(1-x)}TiO_3$.

14. A container capacitor structure formed in a substrate, the container capacitor including a base and generally vertical sidewalls, a lower metal electrode conforming to said sidewalls and base, said lower metal electrode doped with oxygen having an oxidized surface, a high dielectric constant oxide dielectric material adjacent to said oxidized surface of said metal electrode, and an upper layer electrode adjacent to said high dielectric constant oxide dielectric material.

15. A container capacitor as claimed in claim 14 wherein said lower metal electrode is selected from the group consisting of TiN, Pt, Rh, Ru, Re, Ir, Os, and alloys and intermetallic compounds thereof.

16. A container capacitor as claimed in claim 14 wherein said upper layer electrode is selected from the group consisting of TiN, W, Pt, Rh, Ru, Re, Ir, Os, and alloys and intermetallic compounds thereof.

17. A capacitor as claimed in claim 14 wherein said high dielectric constant oxide dielectric material is selected from the group consisting of $Ta_2O_5$ and $Ba_xSr_{(1-x)}TiO_3$.

18. A container capacitor structure formed in a substrate, the container capacitor including a base and generally vertical sidewalls, a lower metal electrode conforming to said sidewalls and base, said lower metal electrode doped with oxygen having an oxidized surface, a high dielectric constant oxide dielectric material adjacent to said oxidized surface of said metal electrode, and an upper layer electrode doped with oxygen adjacent to said high dielectric constant oxide dielectric material.

19. A container capacitor as claimed in claim 18 wherein said metal electrode is selected from the group consisting of TiN, Pt, Rh, Ru, Re, Ir, Os, and alloys and intermetallic compounds thereof.

20. A container capacitor as claimed in claim 18 wherein said upper layer electrode is selected from the group consisting of TiN, W, Pt, Rh, Ru, Re, Ir, Os, and alloys and intermetallic compounds thereof.

21. A container capacitor as claimed in claim 18 wherein said high dielectric constant oxide dielectric material is selected from the group consisting of $Ta_2O_5$ and $Ba_xSr_{(1-x)}TiO_3$.

22. A container capacitor formed in a substrate, the container capacitor including a base and generally vertical sidewalls, a lower metal electrode conforming to said sidewalls and base, said lower metal electrode doped with oxygen and having an oxidized surface, said lower metal electrode selected from the group consisting of TiN, Pt, Rh, Ru, Re, Ir, Os, and alloys and intermetallic compounds thereof, a high dielectric constant oxide dielectric material selected from the group consisting of $Ta_2O_5$ and $Ba_xSr_{(1-x)}TiO_3$ adjacent to said oxidized surface of said lower metal electrode, and an upper layer electrode doped with oxygen, said upper layer electrode selected from the group consisting of TiN, W, Pt, Rh, Ru, Re, Ir, Os, and alloys and intermetallic compounds thereof adjacent to said high dielectric constant oxide dielectric material.

23. A container capacitor formed in a substrate, the container capacitor including a base and generally vertical sidewalls, a first conformal layer of a chemical vapor deposited metal electrode on said base and sidewalls, a second conformal layer of a chemical vapor deposited metal electrode doped with oxygen and having an oxidized surface adjacent to said first layer of said metal electrode, a conformal layer of a high dielectric constant oxide dielectric material adjacent to said oxidized surface of said second layer of said metal electrode, a first conformal layer of a chemical vapor deposited upper layer electrode doped with oxygen adjacent to said high dielectric constant oxide dielectric material, and a second conformal layer of a chemical vapor deposited upper layer electrode adjacent to said first layer of said upper electrode.

24. A container capacitor as claimed in claim 23 wherein said metal electrode is selected from the group consisting of TiN, Pt, Rh, Ru, Re, Ir, Os, and alloys and intermetallic compounds thereof.

25. A container capacitor as claimed in claim 23 wherein said upper layer electrode is selected from the group consisting of TiN, W, Pt, Rh, Ru, Re, Ir, Os, and alloys and intermetallic compounds thereof.

26. A container capacitor as claimed in claim 23 wherein said high dielectric constant oxide dielectric material is selected from the group consisting of $Ta_2O_5$ and $Ba_xSr_{(1-x)}TiO_3$.

* * * * *

UNITED STATES PATENT AND TRADEMARK OFFICE
CERTIFICATE OF CORRECTION

PATENT NO. : 6,646,298 B2
DATED : November 11, 2003
INVENTOR(S) : Rhodes

It is certified that error appears in the above-identified patent and that said Letters Patent is hereby corrected as shown below:

Column 6,
Line 5, "A capacitor as claimed in claim 10 wherein said metal electrode is selected from the group consisting of TiN, W, Pt, Rh, Ru, Re, Ir, Os, and alloys and intermetallic compounds thereof." should read -- A capacitor as claimed in claim 10 wherein said metal electrode is selected from the group consisting of TiN, Pt, Rh, Ru, Re, Ir, Os, and alloys and intermetallic compounds thereof. --

Signed and Sealed this

First Day of June, 2004

JON W. DUDAS
*Acting Director of the United States Patent and Trademark Office*